(12) United States Patent
Lu et al.

(10) Patent No.: US 7,393,468 B2
(45) Date of Patent: Jul. 1, 2008

(54) ADHESIVE WITH DIFFERENTIAL OPTICAL PROPERTIES AND ITS APPLICATION FOR SUBSTRATE PROCESSING

(75) Inventors: Daoqiang Lu, Chandler, AZ (US); Eric J. Li, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 530 days.

(21) Appl. No.: 11/066,704

(22) Filed: Feb. 23, 2005

(65) Prior Publication Data

US 2006/0189093 A1 Aug. 24, 2006

(51) Int. Cl.
*C09K 11/06* (2006.01)
*G01N 21/64* (2006.01)
*C09J 9/00* (2006.01)
*C09J 133/12* (2006.01)
*C09J 133/08* (2006.01)

(52) U.S. Cl. .......................... 252/301.25; 252/301.16; 252/301.34; 252/961; 427/8; 427/157; 524/87; 524/88; 524/89; 524/90; 524/110; 525/351; 525/374; 526/75; 526/204; 526/209; 526/213; 526/215; 526/266; 526/280; 526/326; 526/268; 526/269; 526/270; 526/271

(58) Field of Classification Search ............ 252/301.35, 252/301.16, 961, 301.34; 427/8, 157; 524/87–90, 524/110; 525/351, 374; 526/75, 204, 209, 526/213, 215, 266, 268–271, 280, 326
See application file for complete search history.

(56) References Cited

U.S. PATENT DOCUMENTS

| | | | | | |
|---|---|---|---|---|---|
| 2,631,243 | A | * | 3/1953 | Weber et al. ................. | 250/365 |
| 3,540,580 | A | * | 11/1970 | Columbus et al. ........... | 206/439 |
| 4,405,750 | A | * | 9/1983 | Nakata et al. ................ | 524/717 |
| 4,652,395 | A | * | 3/1987 | Marcina et al. ........ | 252/301.35 |
| 4,751,020 | A | * | 6/1988 | Marten et al. .......... | 252/301.21 |
| 5,310,604 | A | * | 5/1994 | Melancon et al. ........... | 428/447 |
| 6,086,795 | A | * | 7/2000 | Hatton ....................... | 252/582 |
| 6,528,555 | B1 | * | 3/2003 | Nikutowski et al. ......... | 523/116 |
| 6,740,192 | B1 | | 5/2004 | Lu et al. | |
| 2003/0108488 | A1 | * | 6/2003 | Rajaiah et al. ................ | 424/49 |
| 2005/0147489 | A1 | | 7/2005 | Chen et al. | |
| 2005/0221598 | A1 | | 10/2005 | Lu et al. | |

FOREIGN PATENT DOCUMENTS

| | | | |
|---|---|---|---|
| GB | 1429597 | * | 3/1976 |
| GB | 2164200 | * | 3/1986 |
| JP | 05-331438 | * | 12/1993 |
| JP | 2001-003027 | * | 1/2001 |

\* cited by examiner

*Primary Examiner*—C. Melissa Koslow
(74) *Attorney, Agent, or Firm*—Schwabe, Williamson & Wyatt, P.C.

(57) ABSTRACT

An adhesive adapted with particular optical properties, and its use to couple a substrate to a substrate holder during substrate processing are disclosed. After processing the substrate, the optical properties of the adhesive may be exploited to locate and/or remove adhesive residue that may be present on the substrate.

5 Claims, 3 Drawing Sheets

ADHESIVE WITH DIFFERENTIAL OPTICAL PROPERTIES AND ITS APPLICATION FOR SUBSTRATE PROCESSING

BACKGROUND

1. Technical Field

Embodiments of the present invention relate to, but are not limited to, electronic devices and, in particular, to the field of electronic device manufacturing.

2. Description of Related Art

In the current state of electronics, electronic devices such as microprocessors are generally fabricated from silicon wafers. The silicon wafers that are used to form these electronic devices typically undergo many process operations before being split into many pieces of dice (e.g., chips). Each of the chips or dice that are formed typically embodies an electronic device. The operations that are performed on the wafer during the overall fabrication process includes operations to form various electronic components (e.g., conductive interconnects, transistors, resistors, and other components) as well as operations to shape and configure the wafer.

During these operations, which may include various wafer thinning or polishing operations, the wafer is usually coupled to a substrate holding structure such as a support substrate using an adhesive. Once the various operations are completed, the wafer is decoupled from the substrate holder and the adhesive removed. Because of the increasingly smaller sizes and sensitivities of the electronic devices being manufactured from these wafers, the cleanliness and the absence of defects of these wafers becomes an important factor in producing high manufacturing yields.

BRIEF DESCRIPTION OF DRAWINGS

The present invention will be described by way of exemplary embodiments, but not limitations, illustrated in the accompanying drawings in which like references denote similar elements, and in which.

DETAILED DESCRIPTION OF ILLUSTRATIVE EMBODIMENTS

In the following description, for purposes of explanation, numerous details are set forth in order to provide a thorough understanding of the disclosed embodiments of the present invention. However, it will be apparent to one of ordinary skill in the art that these specific details are not required in order to practice the disclosed embodiments of the present invention.

The following description includes terms such as on, onto, on top, underneath, underlying, downward, and the like, that are used for descriptive purposes only and are not to be construed as limiting. That is, these terms are terms that are relative only to a point of reference and are not meant to be interpreted as limitations but are, instead, included in the following description to facilitate understanding of the various aspects of the invention.

Further, various operations will be described as multiple discrete operations, in turn, in a manner that is most helpful in understanding embodiments of the present invention; however, the order of description should not be construed as to imply that these operations are necessarily order dependent. In particular, these operations need not be performed in the order of presentation. In addition, one or more of the described operations may be eliminated while other operations may be added in different embodiments of the invention.

According to various embodiments of the invention, a fluorescent adhesive may be used to couple a substrate to a substrate holder. The fluorescent adhesive, which may include a fluorescent moiety, may emit a light having a first fluorescent spectrum that is sufficiently different from a second fluorescent spectrum of a light that may be emitted from the substrate when the adhesive and the substrate are illuminated with electromagnetic radiation. The sufficient difference between the first and second fluorescent spectrums may facilitate the detection and removal of adhesive residue left on the substrate after the substrate is decoupled from the substrate holder. The substrate may be a wafer, a die, or other electronic substrates while the substrate holder may be a support substrate. The adhesive, in some embodiments, may be a wafer support adhesive (WSA) that may include at least an adhesive base and fluorescent moiety. The adhesive base may include a polymeric adhesive that may bond the substrate to the substrate holder. The fluorescent moiety may be one or more additives that may include fluorescent particles and/or one or more fluorescent functional groups that can be incorporated into the monomer of the polymeric adhesive.

Figure 1:
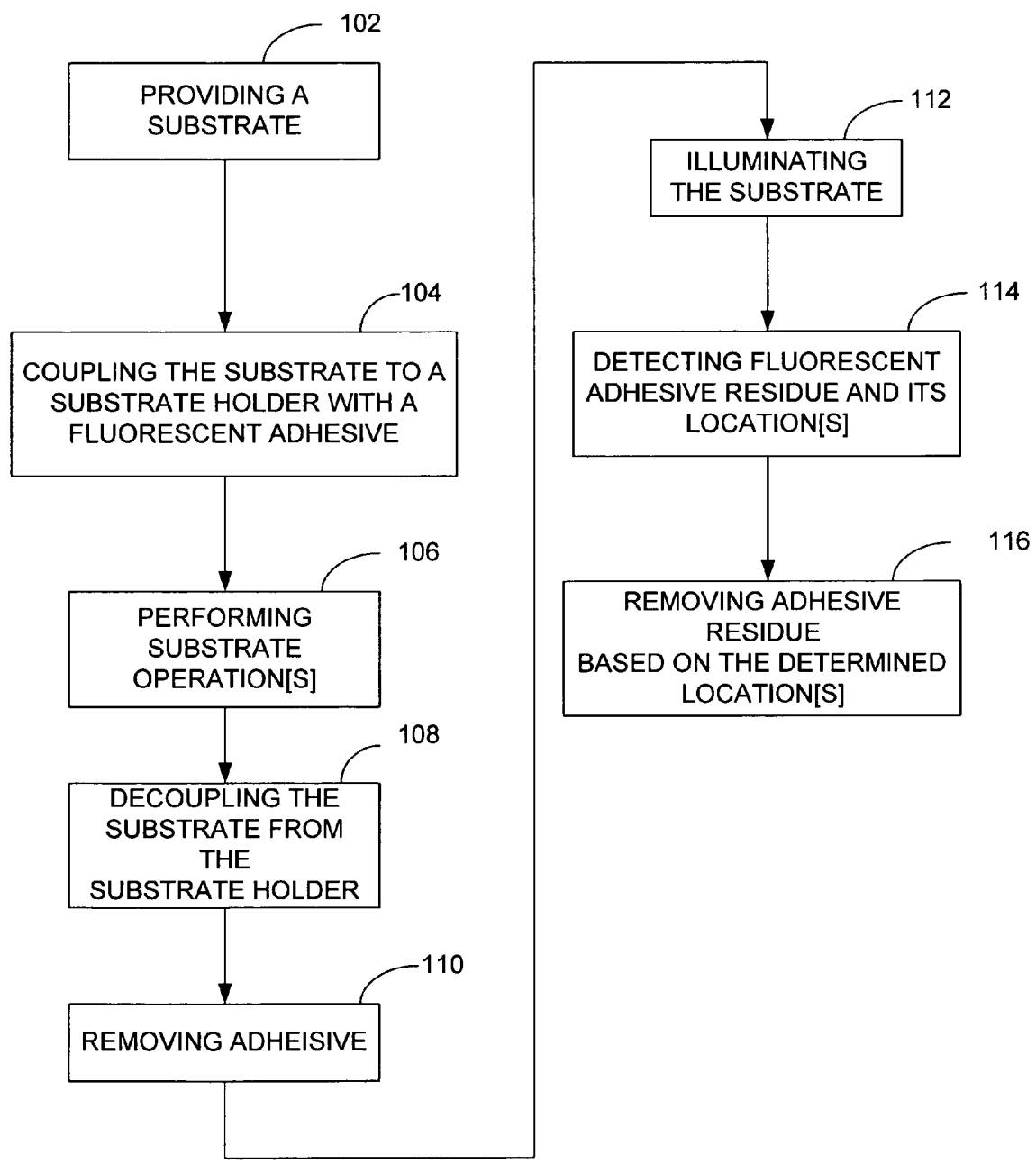
FIG. 1 illustrates a substrate process using a fluorescent adhesive in accordance with some embodiments of the invention.

FIG. 1 depicts a process for processing a substrate using a fluorescent adhesive in accordance with some embodiments. For the embodiments, the process 100 may begin when a substrate is provided at 102. The substrate, in some embodiments, may be a wafer made of a first electromagnetic responsive material that may emit light of a first spectrum when exposed to electromagnetic radiation. The first spectrum, in some instances, may be a first fluorescent spectrum. The first electromagnetic responsive material may be made of a single material or multiple materials including, for example, polyimide, silicon dioxide (SiO2), Copper (Cu), SiC, Si3N4, CDO and/or other materials that may make up, for example, a wafer used to form electronic devices such as microprocessors and random access memory (RAM). Each of these materials may or may not be associated with different fluorescent spectrums (e.g., one or more of these materials may not have a fluorescent spectrum). The combination of these materials as well as the specific molecular structures associated with these materials such as polyimide may result in a specific fluorescent spectrum. Of course, the specific fluorescent spectrum of a given substrate (e.g., wafer) may vary considerably depending upon the composition and molecular structures of the materials that make the substrate.

After providing the substrate, the substrate may be coupled to a substrate holder with a fluorescent adhesive at 104. The coupling of the substrate to the substrate holder with the fluorescent adhesive may further include curing (i.e., polymerizing) the fluorescent adhesive using, for example, thermal heating. In some embodiments, the substrate holder may include or may be a support substrate. The fluorescent adhesive may be made of a second electromagnetic responsive material that emits light of a second spectrum when exposed to electromagnetic radiation. The second electromagnetic responsive material, in various embodiments, may include a fluorescent moiety (to be described in greater detail below).

In various embodiments, the first light spectrum of the first electromagnetic responsive material and the second light spectrum of the second electromagnetic responsive material may be sufficiently different to facilitate detection of adhesive residue that may be left on the substrate after decoupling the substrate from the substrate holder in subsequent operations. In various embodiments, the first and second light spectrums may be first and second fluorescent spectrums.

After coupling the substrate to the substrate holder, one or more substrate operations may be performed on the substrate at 106. In some embodiments, at least one of the operations may be a substrate or wafer thinning operation such as a grinding operation that may planarize the surface of the substrate. Other operations that may be performed include, for example, copper (Cu) electroless operation, etching, photoresist lamination and removal, and so fourth.

Once the one or more substrate operations have been completed, the substrate may be decoupled from the support structure at 108. After decoupling the substrate from the substrate holder, the fluorescent adhesive that coupled the substrate to the substrate holder may be removed or stripped from the substrate at 110. In some embodiments, the removal of the fluorescent adhesive may be accomplished by peeling the adhesive off of the substrate. The adhesive removal operation may result in at least some residual adhesive (i.e., adhesive residue) being left on the substrate surface at one or more substrate locations.

After the removal of some or most of the fluorescent adhesive, the substrate may be exposed or illuminated with electromagnetic radiation at 112. In various embodiments, the electromagnetic radiation used to illuminate the substrate may be ultraviolet, x-ray, visible light, or other electromagnetic radiation. In some embodiments, the electromagnetic radiation used to illuminate the substrate may have wavelengths of about 300 nm to about 500 nm. The electromagnetic radiation used to illuminate the substrate may result in the substrate and the fluorescent adhesive residue emitting lights of a first and a second spectrum, respectively.

During or immediately after the illumination of the substrate, the substrate may be scanned to determine if adhesive residue is present (based on the second fluorescent spectrum generated by the adhesive residue) and, if so, determine the location or locations of the adhesive residue on the substrate at 114. The scanning may be performed, for example, using a fluorescent microscope. The fluorescent microscope, in some embodiments, may include a bandpass filter to facilitate the detection of the adhesive residue. That is, the determination of the location or locations of the adhesive residue may be based on the unique second light spectrum emitted by the adhesive residue. Since the second light spectrum may be distinct from the first light spectrum generated by the one or more materials that make up the substrate, the location or locations of the adhesive residue may be determined.

Based on the determined location or locations of the adhesive residue, the adhesive residue may be removed at 116. This may be accomplished by mechanical means such as additional local tape peeling, selective local chemical etching, or selective local plasma etching. The removal of the adhesive residue may assure high manufacturing yields.

As described previously, the adhesive may be a fluorescent adhesive that may include an adhesive base such as adhesive polymers and fluorescent moiety. In various embodiments, the fluorescent moiety may include at least one of two types of additives, fluorescent particles and fluorescent functional groups that can be incorporated into the monomer of adhesive polymers. In either case, the moiety can be added to an adhesive base to form an adhesive that emits light of a specific fluorescent spectrum in response to electromagnetic radiation.

In the case where the fluorescent moiety includes fluorescent particles, the fluorescent particles may be polymer particles which contains fluorescent ingredient such as of Texas Red-X succinimidyl ester (C41H44N4O10S2). The particles may be about 10 μm or smaller. In some embodiments, the fluorescent polymer particles may have particle sizes of less than or equal to about 0.5 μm. These fluorescent polymer particles may be mixed into the adhesive base prior to being used to adhesively couple a substrate with a substrate holder.

Figure 2:
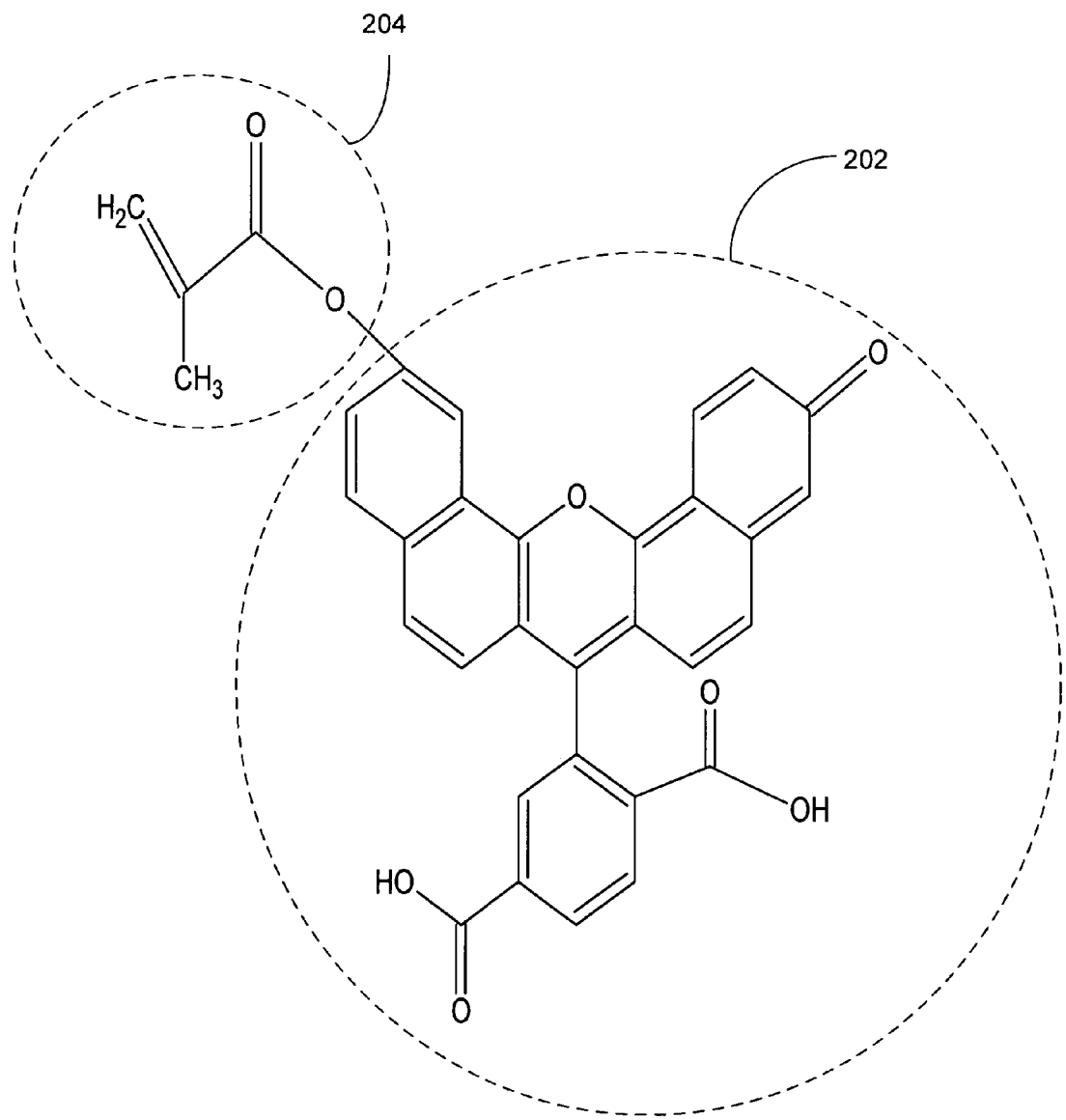
FIG. 2 illustrates a monomer with a fluorescent functional group in accordance with some embodiments.

If the fluorescent moiety includes fluorescent functional group or groups, then the group or groups can be incorporated into the monomer of a polymer adhesive base. FIG. 2 depicts an example fluorescent function group 202 that has been incorporated into a polymeric adhesive monomer 204. In this illustration, the fluorescent functional group 202 is 5-carboxynaphthofluorescein, which may be chemically attached to a methyl methacrylate (MMA) monomer. In this case, the MMA is the polymer monomer 204 while the 5-carboxynaphthofluorescein is the fluorescent functional group 202. When this MMA monomer is mixed with, for example, other acrylic monomers in the adhesive base, the MMA will react with other monomers and may be incorporated into the final polymer molecular chain. Other polymer monomers that may be used includes, for example, butyl acrylate, and ethylene ethyl acrylate (EEA). By including such a fluorescent group (e.g., 5-carboxynaphthofluorescein), the resulting fluorescent adhesive may have a fluorescent spectrum of about 600 nm to about 700 nm. Other fluorescent groups that may be used for similar purposes include, for example, 5carboxy-X-rhodamine (C33H30N2O5) and/or 6-carboxy-X-rhodamine (C33H30N2O5).

Figure 3:
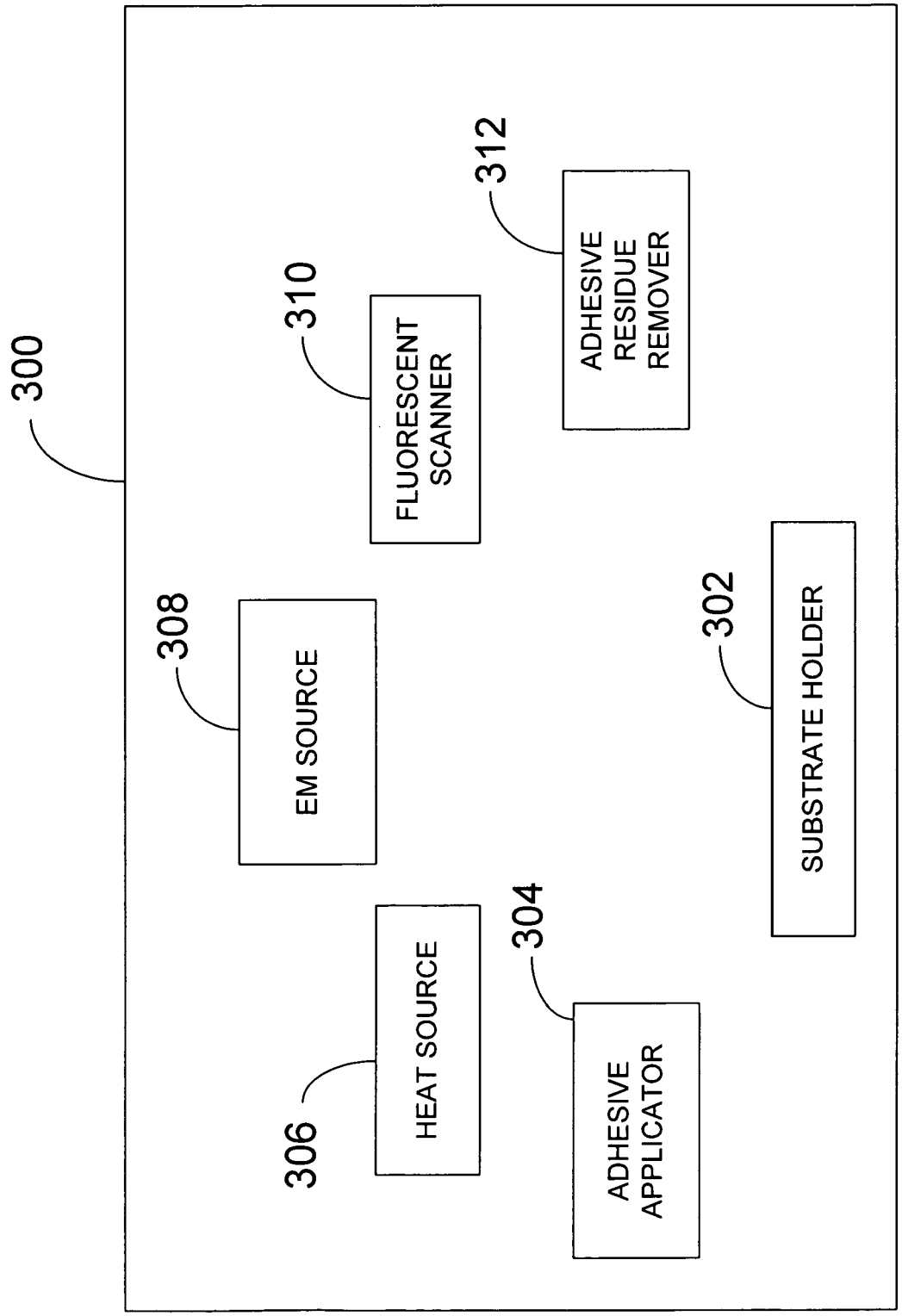
FIG. 3 is a block diagram of an example system that applies and removes a fluorescent adhesive to a substrate in accordance with some embodiments.

FIG. 3 is a block diagram of an example system for processing a substrate including applying and removing a fluorescent adhesive to/from the substrate in accordance with some embodiments of the invention. For the embodiments, the system 300 may include a substrate holder 302, an adhesive applicator 304, a heat source 306, an electromagnetic (EM) radiation source 308, a fluorescent scanner 310, and an adhesive residue remover 312. In addition, additional components such as a wafer thinning unit, adhesive stripper unit, or other components may be included in the system 300 in other embodiments. In yet other embodiments, one or more of the above-recited elements may be included in the system 300.

For the embodiments, the substrate holder 302 may be adapted to a hold substrate such as a wafer. The substrate that may be held by the substrate holder 302 may be made of a first electromagnetic responsive material that may emit light of a first spectrum when exposed to electromagnetic radiation. The substrate holder 302, in some instances, may or may not include a support substrate. The support substrate may be made of, for example, a glass plate or a silicon plate. The system 300 may further include an adhesive applicator 304 adapted to store and dispense an adhesive to a substrate in order to couple the substrate to the substrate holder 302. The adhesive to be applied may be a fluorescent adhesive that includes a second electromagnetic responsive material that emits light of a second spectrum in response to electromagnetic radiation. In various embodiments, the first and second spectrums are sufficiently different to facilitate detection of adhesive residue left on the substrate after decoupling the substrate from the substrate holder 302.

In addition to the substrate holder 302 and the adhesive applicator 304, the system 300 may include other components including an optional heat source 306 or a UV curing component. The heat source 306 (or UV source) may be used to cure the adhesive used to couple the substrate to the substrate holder 302. An electromagnetic source 308 may be used by the system 300 in order to generate electromagnetic (EM) radiation of various spectrums such as ultraviolet, x-ray, visible ray, and other EM radiation spectrums. The generated EM radiation may be used to illuminate the substrate that is processed by the system 300. In some embodiments, the electromagnetic radiation may have wavelengths between about 300 nm to about 500 nm.

A fluorescent scanner 310 may be incorporated in the system 300 in order to scan the substrate and determine whether adhesive residues remain on the substrate. If it is determined that adhesive residue does indeed remain on the substrate then the fluorescent scanner 310 may further determine its location or locations. In some embodiments, the fluorescent scanner 310 may be a fluorescent microscope.

The system 300 may further include an adhesive residue remover 312 that may be used to remove adhesive residue that may be on the substrate that is scanned by the fluorescent scanner 310. The removal of the adhesive residue by the adhesive residue remover 312 may be executed by using the location or locations of the adhesive residue determined by the fluorescent scanner 310. In some embodiments, the adhesive residue remover 312 may be manual, semi, or fully automated residue removal unit. If fully automated, a controller that may include a processor may be coupled to both the fluorescent scanner 310 and the adhesive residue remover 312. Such a controller may use the adhesive location or locations determined by the fluorescent scanner 310 to direct the adhesive residue remover 312 to selectively remove the adhesive residue on the substrate.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the embodiments of the present invention. Therefore, it is manifestly intended that this invention be limited only by the claims.

What is claimed is:

1. An adhesive composition, comprising:
    an adhesive base; and
    a moiety including fluorescent polymer particles, the moiety having a first fluorescent spectrum that is sufficiently different from a second fluorescent spectrum of a substrate, to facilitate detection of adhesive residue left on the substrate, after the substrate is decoupled from a support substrate that is coupled to the substrate using the adhesive composition, wherein the fluorescent polymer particles comprise a chemical having a formula $C_{41}H_{44}N_4O_{10}S_2$.

2. The adhesive composition of claim 1, wherein the fluorescent polymer particles have particle size of less than 0.5 μm.

3. An adhesive composition, comprising;
    an adhesive base including monomers; and
    a moiety, the moiety having a first fluorescent spectrum that is sufficiently different from a second fluorescent spectrum of a substrate, to facilitate detection of adhesive residue left on the substrate, after the substrate is decoupled from a support substrate that is coupled to the substrate using the adhesive composition, the moiety including one or more fluorescent functional groups, the one or more fluorescent functional groups to be incorporated into the monomers when the monomers are polymerized, wherein the one or more fluorescent functional groups comprises at least 5-carboxynaphthofluorescein, 5-carboxy-X-rhodamine ($C_{33}H_{30}N_2O_5$), or 6-carboxy-X-rhodamine ($C_{33}H_{30}N_2O_5$).

4. The adhesive composition of claim 3, wherein the monomers comprise a monomer selected from the group consisting of methyl methacrylate (MMA), butyl acrylate, and ethylene ethyl acrylate (EEA).

5. The adhesive composition of claim 3, wherein the one or more fluorescent functional groups is 5-carboxynaphthofluorescein, and the monomers include methyl methacrylate (MMA), the 5-carboxynaphthofluorescein being incorporated into the methyl methacrylate (MMA), the methyl methacrylate (MMA) being incorporated into a polymer molecular chain after reacting with other monomers in the adhesive base.

* * * * *